(12) United States Patent
Majewski et al.

(10) Patent No.: US 8,305,793 B2
(45) Date of Patent: Nov. 6, 2012

(54) INTEGRATED CIRCUIT WITH AN ARRAY OF RESISTANCE CHANGING MEMORY CELLS

(75) Inventors: Petra Majewski, Munich (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 1209 days.

(21) Appl. No.: 12/122,091

(22) Filed: May 16, 2008

(65) Prior Publication Data

US 2009/0285007 A1  Nov. 19, 2009

(51) Int. Cl.
  *G11C 11/00* (2006.01)
(52) U.S. Cl. .......... 365/148; 365/158; 365/163
(58) Field of Classification Search .......... 365/51, 365/100, 148, 151, 154, 158, 163, 171, 184, 365/185.05, 185.22, 185.28, 189.06, 202, 365/209, 222, 225.7, 232; 438/3, 201, 210, 438/238, 240, 258, 582, 586, 597; 257/2, 257/4, 5, 22, 40, 48, 208, 209, 213, 288, 257/295, 296, 313, 315, 316, 324, 347, 351, 257/368, 406, 411, 421, 476, 516, 528, 532, 257/774; 374/178; 427/96.7; 430/290
See application file for complete search history.

(56) References Cited

U.S. PATENT DOCUMENTS

| | | | | |
|---|---|---|---|---|
| 7,639,521 | B2* | 12/2009 | Baek et al. | 365/148 |
| 2006/0022347 | A1* | 2/2006 | Campbell | 257/762 |
| 2006/0215445 | A1* | 9/2006 | Baek et al. | 365/158 |
| 2007/0228354 | A1* | 10/2007 | Scheuerlein | 257/3 |
| 2007/0236981 | A1* | 10/2007 | Herner | 365/148 |
| 2008/0025068 | A1* | 1/2008 | Scheuerlein et al. | 365/148 |

OTHER PUBLICATIONS

J.F. Gibbons et al.., Solid-State Electronics article entitled "Switching Properties of Thin NiO Films"; 1964; 13 pgs.
I.G. Baek et al., IEEE article entitled "Highly Scalable Non-Volatile Resistive Memory Using Simple Binary Oxide Driven by Asymmetric Unipolar Voltage Pulses"; © 2004; 4 pgs.
B.J. Choi et al., Journal of Applied Physics article entitled "Resistive Switching Mechanism of TiO2 Thin Films Grown by Atomic-Layer Deposition"; © 2005; 10 pgs.

* cited by examiner

*Primary Examiner* — Alexander Sofocleous
*Assistant Examiner* — Harry W Byrne
(74) *Attorney, Agent, or Firm* — Dicke, Billig & Czaja, PLLC

(57) ABSTRACT

An integrated circuit includes an array of resistance changing memory cells, and a circuit configured to apply an initialization signal to a first one of the memory cells that is in a virgin resistance state. The initialization signal is configured to modify the first memory cell without switching an operation state of the first memory cell.

20 Claims, 10 Drawing Sheets

INTEGRATED CIRCUIT WITH AN ARRAY OF RESISTANCE CHANGING MEMORY CELLS

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element. A set pulse changes the resistance of the element from a high resistance state to a low resistance state, and a reset pulse changes the resistance of the element from a low resistance state to a high resistance state.

Transition Metal Oxides (TMO) belong to the group of materials which can be used for non-volatile resistance switching memory elements. Such materials include, for example, $NiO_x$, $TiO_2$, and Cr-doped $SrTi(Zr)O_3$. One theory explains the switching behavior of TMO memory elements by the formation and rupture of a conducting filament in the oxide matrix. According to this theory, the conducting filament is formed by the collection of oxygen vacancies at structural defects due to the applied electrical field during the set operation, and destroyed by thermal rupture during the reset.

The initial (i.e., "virgin") resistance state of TMO memory elements is a high resistance state. A single high-voltage quasi-static sweep or a triangular voltage pulse can be applied to the memory element during an initialization phase in order to reach a switching of the element from the virgin high resistance state to the low resistance state. The high voltage initialization sweep used in the initial formation of the conducting filament typically has a much larger amplitude than that of the standard set pulses used in normal operation. This can be explained by the formation of an initial conducting filament, which is not completely destroyed during the consecutive reset but only broken up at a weak link. Therefore, the resistance of a memory element in the reset state is usually lower than that of a memory cell in the virgin state. The conducting filament can be "reformed" using a lower voltage during the subsequent set operations.

The high initial formation voltage ($V_{formation}$) for switching a TMO memory element out of the virgin resistance state is typically much larger than the set voltage pulses ($V_{set}$), and the set voltage pulses ($V_{set}$) are typically larger than the reset voltage pulses ($V_{reset}$) (i.e., $V_{formation} \gg V_{set} > V_{reset}$). The high initial formation voltage amplitude used during initialization holds the risk that the memory element could get damaged by the high current flow when it switches to the low resistance (set) state, which can lead to an unreliable memory cell or even to a complete destruction of the cell. Also, the addition of high voltage circuits to a memory device for performing the initialization adds to the cost and complexity of the memory device.

For some materials, such as for $NiO_x$ films, the initial formation voltage ($V_{formation}$) can be reduced by under-oxidation of the film. However, the initial formation voltage for these $NiO_x$ memory elements can still be relatively large (e.g., approximately 50% higher than the normal set voltage ($V_{set}$). In addition, the under-oxidation of the $NiO_x$ film goes along with a reduction of the initial resistance of the material. As the initial resistance defines the maximum accessible switching ratio, the sense margin of the memory element is also strongly reduced by the under-oxidation.

SUMMARY

One embodiment provides an integrated circuit that includes an array of resistance changing memory cells, and a circuit configured to apply an initialization signal to a first one of the memory cells that is in a virgin resistance state. The initialization signal is configured to modify the first memory cell without switching an operation state of the first memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
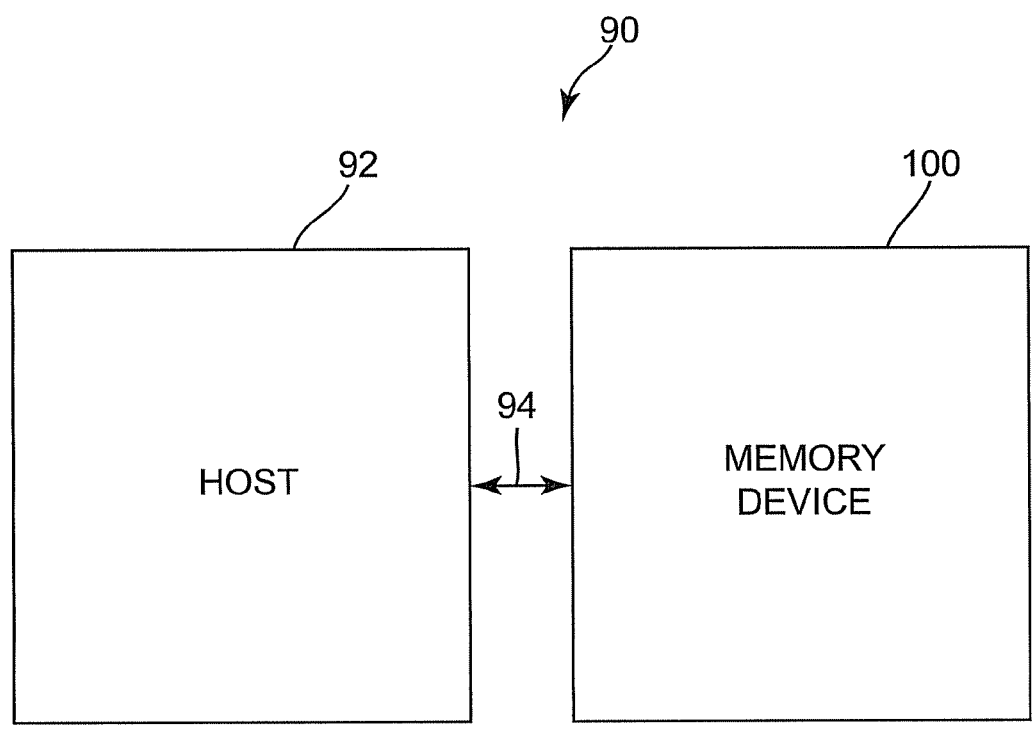
FIG. 1 is a block diagram illustrating a system with a memory device according to one embodiment.

FIG. 1 is a block diagram illustrating a system 90 according to one embodiment. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a resistive or resistance changing memory device.

Figure 2:
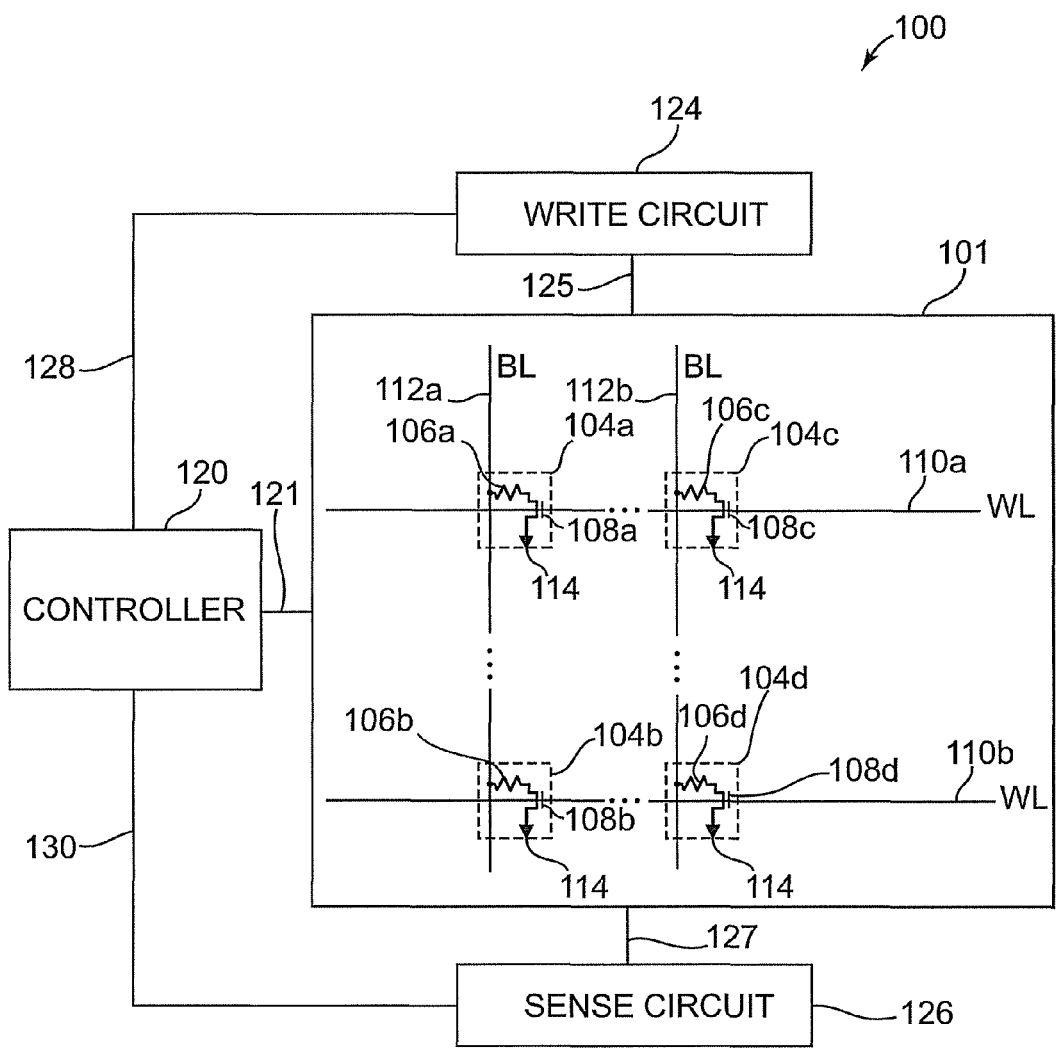
FIG. 2 is a diagram illustrating a memory device according to one embodiment.

FIG. 2 is a diagram illustrating one embodiment of a memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of resistance changing memory cells 104a-104d (collectively referred to as memory cells 104), a plurality of bit lines (BLs) 112a-112b (collectively referred to as bit lines 112), and a plurality of word lines (WLs) 110a-110b (collectively referred to as word lines 110).

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each memory cell 104 is electrically coupled to a word line 110, a bit line 112, and a common or ground 114. Memory cell 104a is electrically coupled to bit line 112a, word line 110a, and common or ground 114, and memory cell 104b is electrically coupled to bit line 112a, word line 110b, and common or ground 114. Memory cell 104c is electrically coupled to bit line 112b, word line 110a, and common or ground 114, and memory cell 104d is electrically coupled to bit line 112b, word line 110b, and common or ground 114.

Each memory cell 104 includes a resistance changing element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode or diode-like structure is used in place of transistor 108. In this case, a diode and resistance changing element 106 are coupled in series between each cross point of word lines 110 and bit lines 112.

Memory cell 104a includes a resistance changing element 106a and transistor 108a. One side of resistance changing element 106a is electrically coupled to bit line 112a, and the other side of resistance changing element 106a is electrically coupled to one side of the source-drain path of transistor 108a. The other side of the source-drain path of transistor 108a is electrically coupled to common or ground 114. The gate of transistor 108a is electrically coupled to word line 110a.

Memory cell 104b includes resistance changing element 106b and transistor 108b. One side of resistance changing element 106b is electrically coupled to bit line 112a, and the other side of resistance changing element 106b is electrically coupled to one side of the source-drain path of transistor 108b. The other side of the source-drain path of transistor 108b is electrically coupled to common or ground 114. The gate of transistor 108b is electrically coupled to word line 110b.

Memory cell 104c includes resistance changing element 106c and transistor 108c. One side of resistance changing element 106c is electrically coupled to bit line 112b and the other side of resistance changing element 106c is electrically coupled to one side of the source-drain path of transistor 108c. The other side of the source-drain path of transistor 108c is electrically coupled to common or ground 114. The gate of transistor 108c is electrically coupled to word line 110a.

Memory cell 104d includes resistance changing element 106d and transistor 108d. One side of resistance changing element 106d is electrically coupled to bit line 112b and the other side of resistance changing element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each resistance changing element 106 is electrically coupled to a common or ground 114 and each transistor 108 is electrically coupled to a bit line 112. For example, for memory cell 104a, one side of resistance changing element 106a is electrically coupled to common or ground 114. The other side of resistance changing element 106a is electrically coupled to one side of the source-drain path of transistor 108a. The other side of the source-drain path of transistor 108a is electrically coupled to bit line 112a.

In one embodiment, each resistance changing element 106 includes a resistance changing material that may be made up of a variety of materials. In one embodiment, each resistance changing element 106 is made from a transition metal oxide (TMO) material, such as $NiO_x$, $TiO_2$, or Cr-doped $SrTi(Zr)O_3$.

The two or more states of resistance changing elements 106a-106d differ in their electrical resistance. In one embodiment, the two or more states are two states and a binary system is used, wherein the two states are assigned bit values of "0" and "1. In other embodiments, the two or more states can be any suitable number of states in the resistance changing material of a resistance changing element.

Controller 120 includes a microprocessor, microcontroller, or other suitable logic circuitry for controlling the operation of memory device 100. Controller 120 controls read, write, and initialization operations of memory device 100 including the application of control and data signals to memory array 101 through write circuit 124 and sense circuit 126. In one embodiment, write circuit 124 provides voltage pulses through signal path 125 and bit lines 112 to memory cells 104 to initialize the memory cells, and to program the memory cells. In other embodiments, write circuit 124 provides current pulses through signal path 125 and bit lines 112 to memory cells 104 to initialize the memory cells, and to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During an initialization operation of memory cell 104a, word line 110a is selected to activate transistor 108a. With word line 110a selected, one or more initialization signals (e.g., current or voltage pulses) are selectively enabled by write circuit 124 and sent through bit line 112a to resistance changing element 106a. The initialization signals according to one embodiment cause the resistance changing element 106a to change from an initial or virgin high resistance state to a low resistance state.

During a set operation of memory cell 104a, word line 110a is selected to activate transistor 108a. With word line 110a selected, one or more set current or voltage pulses are selectively enabled by write circuit 124 and sent through bit line 112a to resistance changing element 106a. The set current or voltage pulses cause the resistance changing element 106a to enter a low resistance state.

During a reset operation of memory cell 104a, word line 110a is selected to activate transistor 108a. With word line 110a selected, a reset current or voltage pulse is selectively enabled by write circuit 124 and sent through bit line 112a to resistance changing element 106a. The reset current or voltage pulses cause the resistance changing element 106a to enter a high resistance state. Memory cells 104b-104d and other memory cells 104 in memory array 101 are initialized, set, and reset similarly to memory cell 104a using similar current or voltage pulses.

Figure 3A:
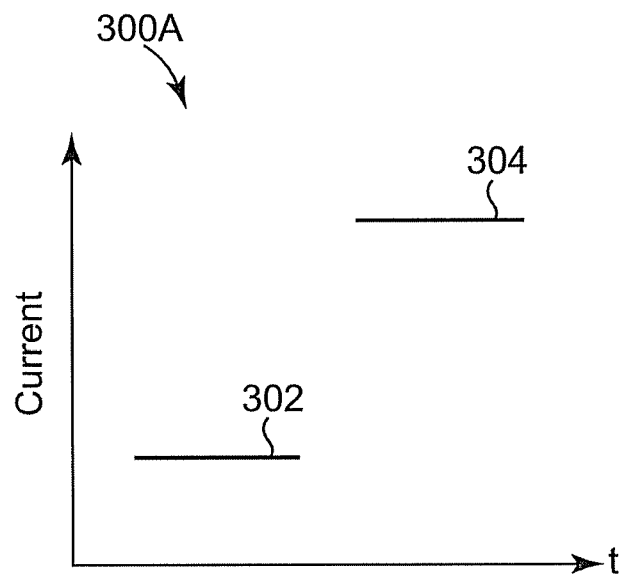
FIG. 3A is a diagram illustrating a graph of current compliance limits for set and reset pulses according to one embodiment.

FIG. 3A is a diagram illustrating a graph 300A of current compliance limits for set and reset pulses for memory device 100 according to one embodiment. The vertical axis in graph 300A represents current amplitude, and the horizontal axis represents time. Line 302 represents the current compliance limit for set pulses generated by memory device 100 according to one embodiment. Line 304 represents the current compliance limit for reset pulses generated by memory device 100 according to one embodiment. As shown in FIG. 3A, the current compliance limit 304 for reset pulses is higher than the current compliance limit 302 for set pulses. In one embodiment, controller 120 (FIG. 2) is configured to monitor the current through memory cells 104 during the application of signals (e.g., initialization signals, set pulses, and reset pulses) to these cells 104, and prevent the current from exceeding the current compliance limit (e.g., by modification of the amplitude of the signal being applied).

Figure 3B:
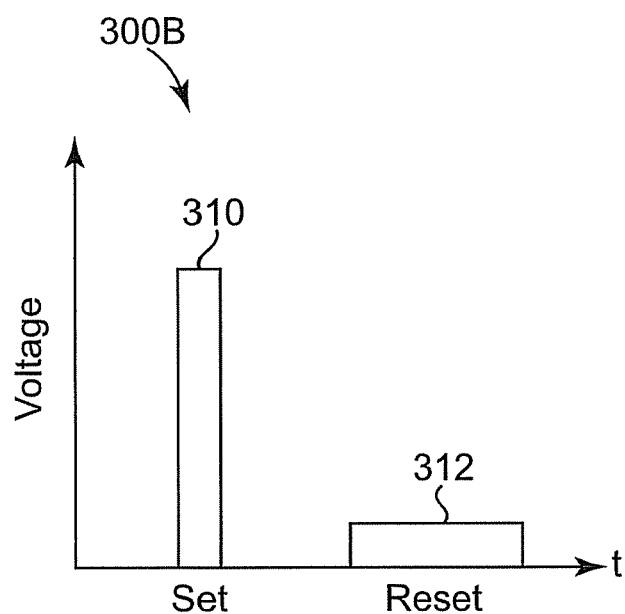
FIG. 3B is a diagram illustrating a graph of set and reset pulses according to one embodiment.

FIG. 3B is a diagram illustrating a graph 300B of set and reset pulses generated by memory device 100 according to one embodiment. The vertical axis in graph 300B represents voltage amplitude, and the horizontal axis represents time. Pulse 310 is a set pulse and pulse 312 is a reset pulse. In one embodiment, the set pulses (e.g., set pulse 310) generated by memory device 100 have a larger amplitude than the reset pulses (e.g., reset pulse 312), and the reset pulses generated by memory device 100 have a longer duration than the set pulses.

As described above in the Background section, a virgin TMO memory element is in a high resistance state (i.e., high-ohmic) with a resistance higher than that of the high-ohmic state after cycling. This is due to the fact that, for the virgin cell, an initial conducting filament has not yet been formed in the oxide matrix, whereas for a non-virgin high-ohmic memory cell this conducting filament already exists but is ruptured at a weak link. Therefore, more energy is typically applied in order to form the initial filament from the virgin state of the memory element. However, there are problems or disadvantages with forming the initial filament by using a single high-voltage sweep, as described above in the Background section.

In one embodiment, instead of forming the initial conducting filament by a single high voltage sweep, the memory cells 104 in memory array 101 are each "trained" by the application of a number (e.g., 1, 10, 100) of initialization pulses in order to pre-form a conducting filament without switching the cell to the low resistive state. With this method according to one embodiment, the oxygen vacancies are collected consecutively at the structural defects, and the resistance of the memory cells 104 decreases gradually. After the training sequence of initialization pulses, the threshold voltage needed to finally switch the memory cell to the low resistance state is reduced, compared to a cell without training, due to the already partially pre-formed conducting filament.

Figure 4A:
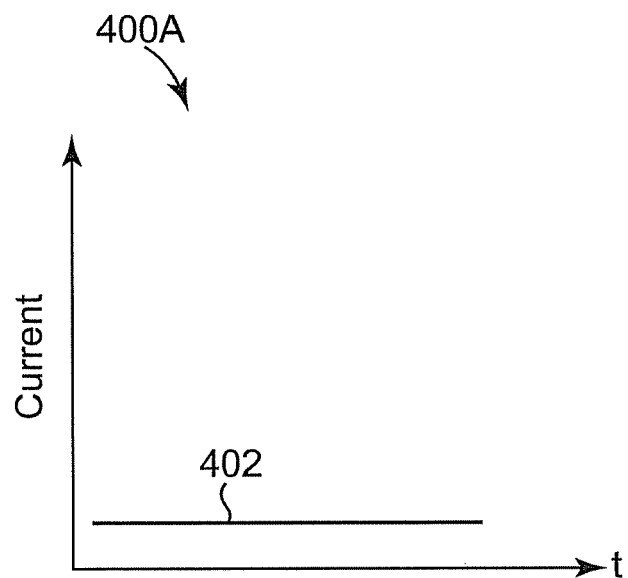
FIG. 4A is a diagram illustrating a graph of a current compliance limit for initialization pulses according to one embodiment.

FIG. 4A is a diagram illustrating a graph 400A of a current compliance limit for initialization pulses generated by memory device 100 according to one embodiment. The vertical axis in graph 400A represents current amplitude, and the horizontal axis represents time. Line 402 represents the current compliance limit for initialization pulses generated by memory device 100 according to one embodiment. In one embodiment, the current compliance limit 402 for initialization pulses is lower than the current compliance limit 302 (FIG. 3A) for set pulses, which is lower than the current compliance limit 304 (FIG. 3A) for reset pulses.

Figure 4B:
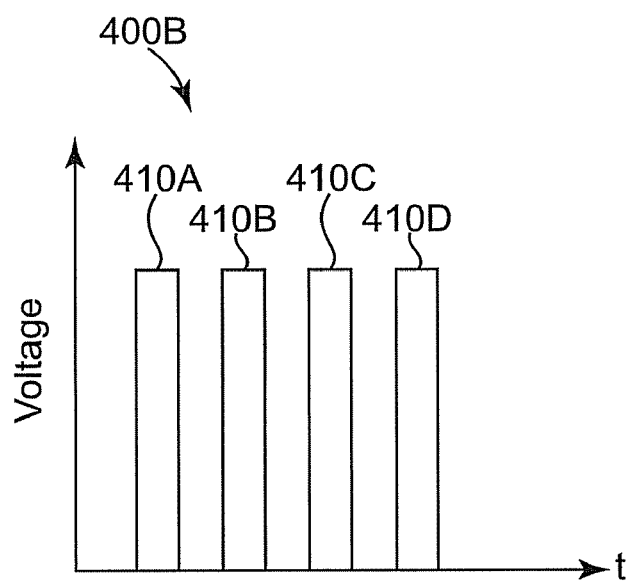
FIG. 4B is a diagram illustrating a graph of initialization pulses according to one embodiment.

FIG. 4B is a diagram illustrating a graph 400B of initialization pulses generated by memory device 100 according to one embodiment. The vertical axis in graph 400B represents voltage amplitude, and the horizontal axis represents time. Four initialization voltage pulses 410A-410D (collectively referred to as initialization pulses 410) are shown in FIG. 4B. In one embodiment, the initialization pulses (e.g., initialization pulses 410) generated by memory device 100 have the same amplitude or substantially the same amplitude and the same duration or substantially the same duration as the set pulses (e.g., set pulse 310). In another embodiment, the initialization pulses generated by memory device 100 have a lower amplitude than the set pulses.

In one embodiment, memory device 100 is configured to generate initialization pulses 410 during an initialization phase of memory array 101. Memory device 100 according to one embodiment generates a plurality of initialization pulses 410 for each memory cell 104 in memory array 101. In one embodiment, the initial or virgin resistance state of the resistance changing elements 106 in the memory cells 104 is a high resistance state. Thus, prior to operation of memory device 100, each of the elements 106 begins in a high resistance state. In one embodiment, one or more of the initialization pulses 410 (e.g., the first three pulses 410A-410C shown in FIG. 4B) applied to each element 106 causes a training of the element 106 and a lowering of the formation voltage for the element 106 without causing a switching of an operation state of the element 106 (i.e., a switch from a high resistance state to a low resistance state), and one of the initialization pulses 410 (e.g., the fourth pulse 410D shown in FIG. 4B) causes a switching of the element 106 to the low resistance state.

Figure 5:
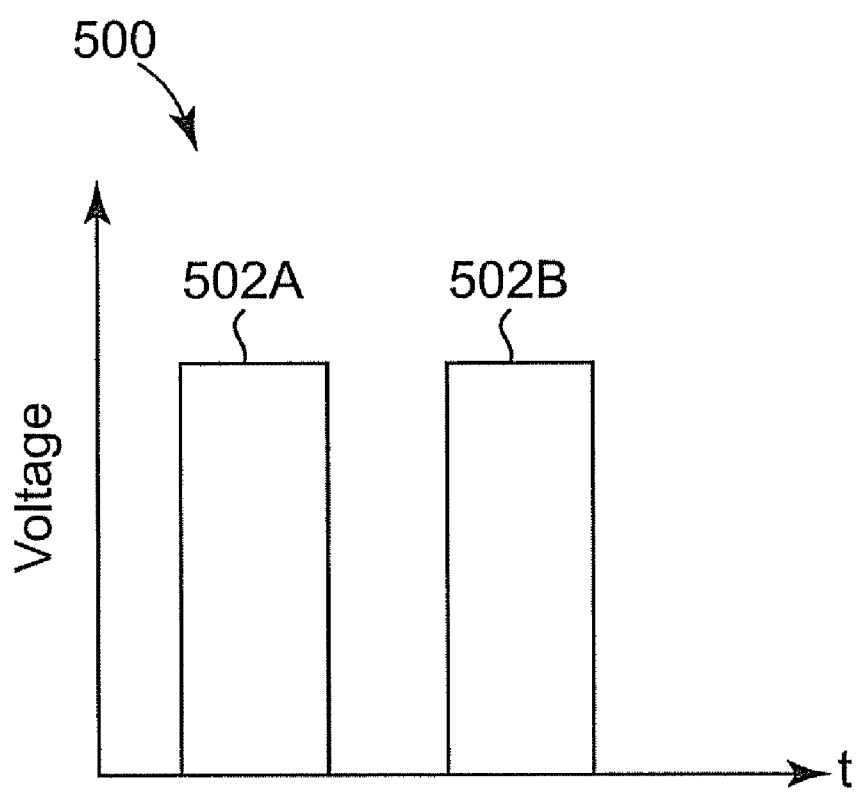
FIG. 5 is a diagram illustrating a graph of initialization pulses according to another embodiment.

FIG. 5 is a diagram illustrating a graph 500 of initialization pulses generated by memory device 100 according to another embodiment. The vertical axis in graph 500 represents voltage amplitude, and the horizontal axis represents time. Two initialization voltage pulses 502A and 502B (collectively referred to as initialization pulses 502) are shown in FIG. 5. In the illustrated embodiment, the initialization pulses 502 generated by memory device 100 have the same amplitude or substantially the same amplitude as the set pulses (e.g., set pulse 310), and a longer duration than the set pulses. In another embodiment, the initialization pulses generated by memory device 100 have a lower amplitude than the set pulses.

In the embodiment shown in FIG. 5, the initialization pulses 502 each have a longer duration than the initialization pulses 410 shown in FIG. 4B. One advantage of using wider (i.e., longer duration) initialization pulses, such as those shown in FIG. 5, is that they increase the stress on the memory cells 104, which can reduce the number of initialization pulses that are used to eventually cause a switching of the memory cells 104 from their initial or virgin high resistance state to the low resistance state.

In one embodiment, memory device 100 is configured to generate initialization pulses 502 during an initialization phase of memory array 101. Memory device 100 according to one embodiment generates a plurality of initialization pulses 502 for each memory cell 104 in memory array 101. In one embodiment, one or more of the initialization pulses 502 (e.g., the first pulse 502A shown in FIG. 5) applied to each cell 104 causes a training of the cell 104 and a lowering of the formation voltage for the cell 104 without causing a switching of the cell 104 to a low resistance state, and one of the initialization pulses 502 (e.g., the second pulse 502B shown in FIG. 5) causes a switching of the cell 104 to the low resistance state.

In one embodiment, memory device 100 is configured to train memory array 101 using a series of initialization voltage pulses (e.g., pulses 410 or 502) as described above. In another embodiment, memory device 100 is configured to train memory array 101 using a series of initialization voltage sweeps (e.g., triangular voltage pulses). In one embodiment, each voltage sweep involves gradually ramping an applied voltage upward to predetermined maximum amplitude, and then gradually ramping the applied voltage downward to a predetermined minimum amplitude. In one embodiment, a series of voltage sweeps up to a maximum "sub-threshold" voltage, Vmax, are applied to each cell 104 in the memory array 101. The term "sub-threshold" according to one embodiment means a voltage that is less than that needed to switch a memory cell 104 from its initial or virgin high resistance state to a low resistance state.

Like the initialization pulses described above, the series of voltage sweeps also leads to a reduction of the formation voltage for the initial formation of the conducting filaments in the cells 104. In one embodiment, the maximum sub-threshold voltage, Vmax, is kept constant for all of the sweeps. In another embodiment, the maximum sub-threshold voltage, Vmax, is varied for one or more of the sweeps (e.g., increased stepwise). The initial switching from the initial or virgin high resistance state to the low resistance state for each cell 104 is accomplished in one embodiment by the final voltage sweep. In another embodiment, the training is stopped for a cell 104 when a predetermined threshold current flow through the cell 104 is reached, and then the cell 104 is switched to the low resistance state by using one or more initialization pulses (e.g., pulses 410 or 502).

Figure 6:
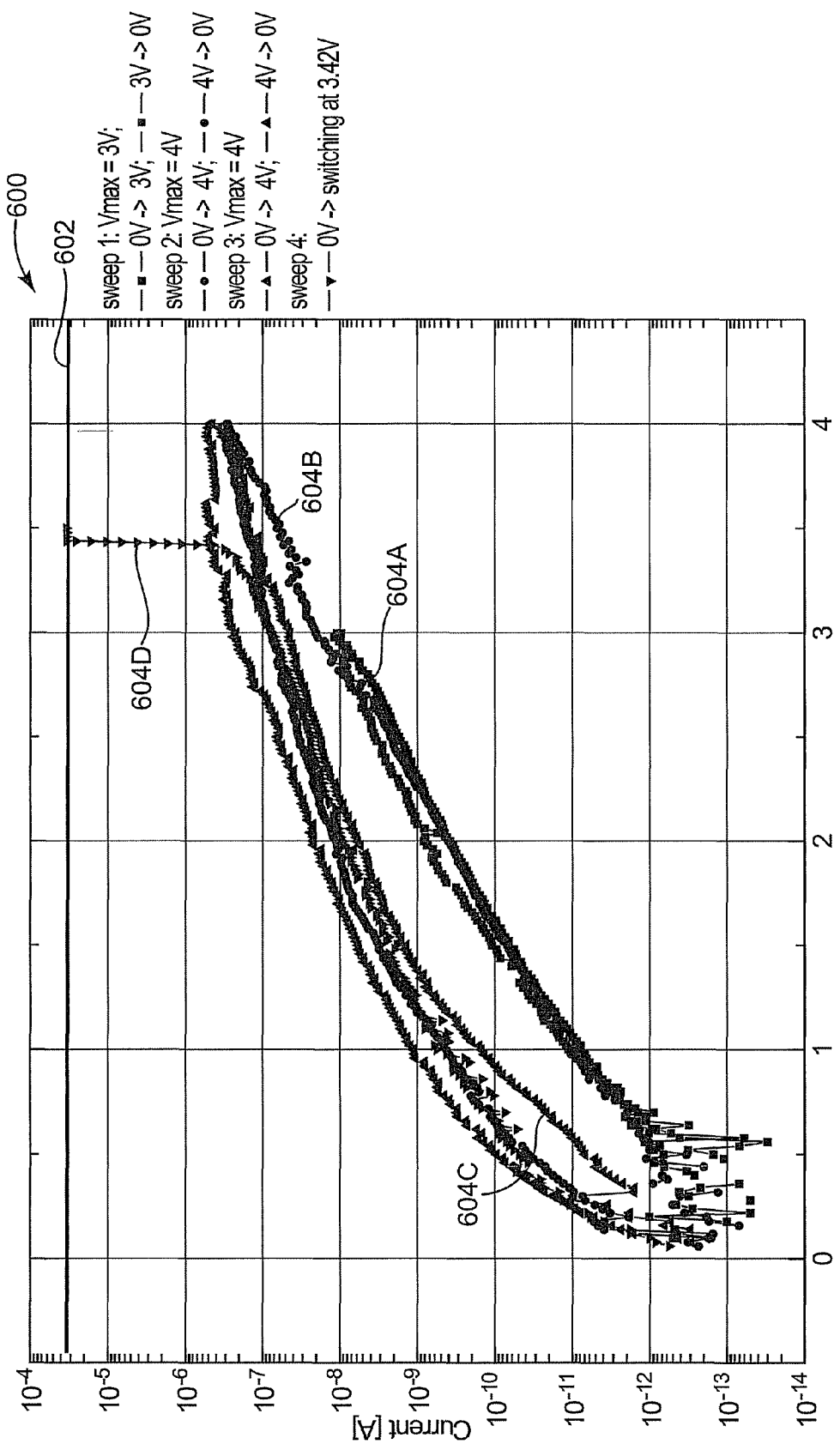
FIG. 6 is a diagram illustrating a graph of current versus applied voltage during initialization of a memory device according to one embodiment.

FIG. 6 is a diagram illustrating a graph 600 of current versus applied voltage during initialization of a memory cell 104 according to one embodiment. In the illustrated embodiment, the memory cell that was trained was a NiO$_x$ memory cell. The vertical axis in graph 600 represents the measured current flow through the memory cell, and the horizontal axis represents applied voltage. The virgin memory cell was trained by a sequence of three successive sub-threshold voltage sweeps 604A-604C. During the first sweep 604A, the voltage applied to the memory cell was ramped upward from zero volts to the maximum sub-threshold voltage, Vmax, which was three volts for the first sweep 604A, and then the applied voltage was ramped downward back to zero volts. During the second sweep 604B, the voltage applied to the memory cell was ramped upward from zero volts to the maximum sub-threshold voltage, Vmax, which was four volts for the second sweep 604B, and then the applied voltage was ramped downward back to zero volts. During the third sweep 604C, the voltage applied to the memory cell was ramped upward from zero volts to the maximum sub-threshold voltage, Vmax, which was four volts for the third sweep 604C, and then the applied voltage was ramped downward back to zero volts. It can be seen from the graph 600 that the resistance of the memory cell was reduced with every sweep 604A-604C (i.e., there was a higher current flow through the memory cell with each successive sweep).

As shown in graph 600, the memory cell switches to the low-resistance state during the fourth sweep 604D. During the fourth sweep 604D, the voltage applied to the memory cell was ramped upward from zero volts. When the applied voltage reached about 3.42 volts, the current through the memory cell quickly jumped above the current compliance limit 602, indicating that the memory cell switched to the low resistance state. Thus, the switching of the memory cell occurred at a voltage (3.42 volts) that was less than the previously applied maximum sub-threshold voltages, Vmax, that were used during the second sweep 604B and the third sweep 604C. Graph 600 demonstrates that by training a memory cell with an appropriate sequence of initialization voltage sweeps (e.g., sweeps 600A-600C), the formation voltage for the memory cell can be significantly reduced.

The number of initialization pulses or initialization sweeps that are needed to cause a memory cell 104 to switch from the initial or virgin high resistance state to the low resistance state may vary from cell to cell. If a fixed number of pulses or sweeps are applied to each cell 104, any cells 104 that are more easily switched to the low resistance state may have additional pulses or sweeps applied to them after the cells have already switched states. This can cause one or more of these cells 104 to enter a "hard set" state, which means that it may be difficult to cause a reset of such cells 104. In one embodiment, memory device 100 employs a feedback loop to monitor the training of the cells 104, minimize the stress on each cell 104, and to help prevent cells 104 from entering a hard set state. In one embodiment, memory device 100 monitors the current flow through each cell 104 during the training or initialization phase, and terminates an initialization signal a predetermined time, Δt, after the current flow through a cell 104 reaches a threshold maximum level. In one embodiment, the predetermined time, Δt, may be zero, and the initialization pulse is terminated as soon as the current flow through a cell 104 reaches the threshold maximum level.

Figure 7A:
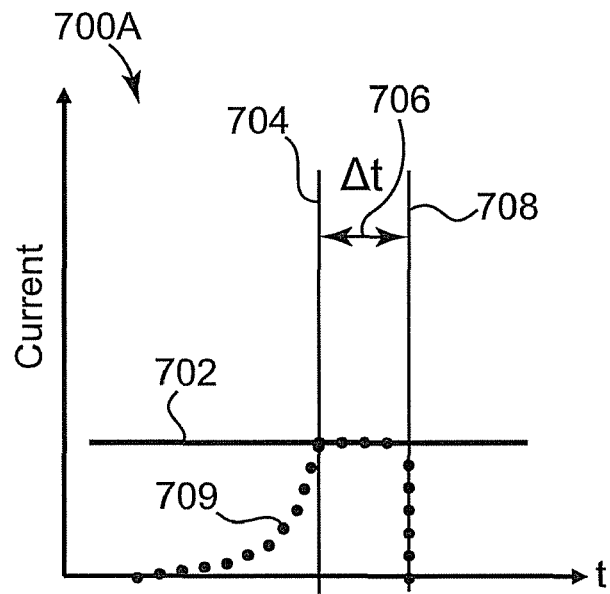
FIG. 7A is a diagram illustrating a graph of current flow over time through a memory cell during the application of a feedback-controlled initialization pulse according to one embodiment.

FIG. 7A is a diagram illustrating a graph 700A of current flow over time through a memory cell 104 during the application of a feedback-controlled initialization pulse according to one embodiment. The vertical axis in graph 700A represents current amplitude, and the horizontal axis represents time. Line 702 represents the current compliance limit for initialization pulses generated by memory device 100 according to one embodiment. In one embodiment, the current compliance limit 702 for initialization pulses is lower than the current compliance limit 302 (FIG. 3A) for set pulses, which is lower than the current compliance limit 304 (FIG. 3A) for reset pulses. Curve 709 represents the current flowing through a memory cell 104 during the application of the feedback-controlled initialization pulse 710 shown in FIG. 7B. Curve 709 is described in further detail below with reference to FIG. 7B.

Figure 7B:
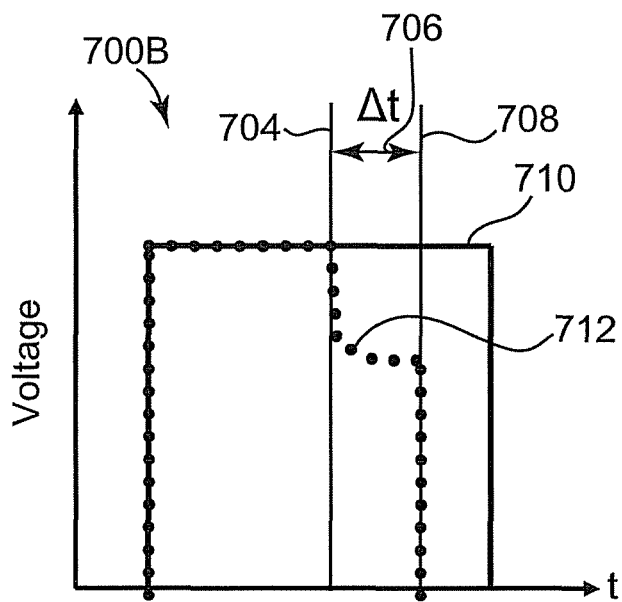
FIG. 7B is a diagram illustrating a graph of a feedback-controlled initialization pulse according to one embodiment.

FIG. 7B is a diagram illustrating a graph 700B of a feedback-controlled initialization pulse 710 generated by memory device 100 according to one embodiment. The vertical axis in graph 700B represents voltage amplitude, and the horizontal axis represents time. In the illustrated embodiment, the initialization pulse 710 generated by memory device 100 has the same amplitude or substantially the same amplitude as the set pulses (e.g., set pulse 310), and a longer duration than the set pulses (if not cut shorter by the feedback control).

In one embodiment, memory device 100 is configured to monitor the current flowing through a memory cell 104 while initialization pulse 710 is being applied to the memory cell 104. In the embodiment shown in FIGS. 7A and 7B, when the pulse 710 is first applied to a memory cell 104, the current flow through the memory cell 104 gradually begins to increase, as shown by curve 709 in FIG. 7A. The current through the memory cell 104 continues to rise during the application of pulse 710 until the current reaches the current compliance limit 702 at the point in time indicated at 704. Memory device 100 monitors the current through the cell 104, and when the memory device 100 detects that the current has reached the current compliance limit at point 704, memory device 100 causes the voltage pulse 710 to decrease in amplitude as indicated by curve 712, which holds the current through the cell 104 constant at the compliance limit 702, and prevents the current from exceeding the compliance limit 702. If the current through the memory cell 104 had not reached the compliance limit 702 during the application of the pulse 710, the pulse 710 would continue on for its normal duration as shown in FIG. 7B.

At the point in time 704 at which the current through the cell 104 reaches the compliance limit 702, memory device 100 waits a predetermined period of time ($\Delta t$) 706, and at the end 708 of the period of time 706, memory device 100 terminates the pulse 710, as shown by curve 712. In one embodiment, memory device 100 also terminates the initialization pulse sequence at point 708 so that no further initialization pulses are applied to the memory cell 104.

Figure 8A:
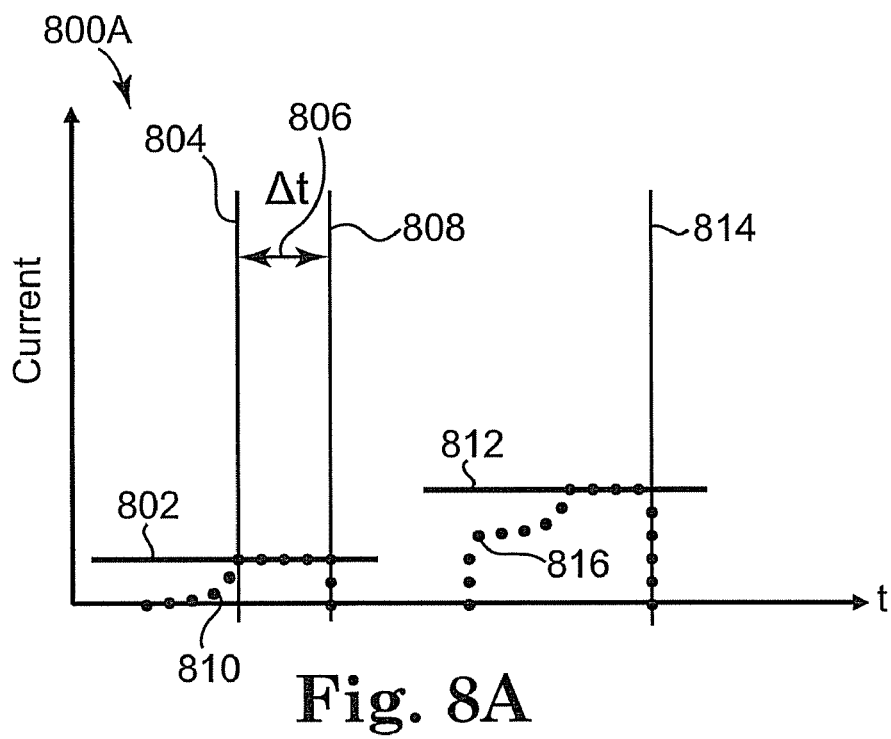
FIG. 8A is a diagram illustrating a graph of current flow over time through a memory cell during the application of multiple feedback-controlled initialization pulses according to one embodiment.

FIG. 8A is a diagram illustrating a graph 800A of current flow over time through a memory cell 104 during the application of multiple feedback-controlled initialization pulses according to one embodiment. The vertical axis in graph 800A represents current amplitude, and the horizontal axis represents time. Lines 802 and 812 represent current compliance limits for initialization pulses generated by memory device 100 according to one embodiment. In one embodiment, the current compliance limits 802 and 812 for initialization pulses are both lower than the current compliance limit 302 (FIG. 3A) for set pulses, which is lower than the current compliance limit 304 (FIG. 3A) for reset pulses. In the illustrated embodiment, current compliance limit 812 is larger than current compliance limit 802. Curve 810 represents the current flowing through a memory cell 104 during the application of the feedback-controlled initialization pulse 818A shown in FIG. 8B, and curve 816 represents the current flowing through the memory cell 104 during the application of the feedback-controlled initialization pulse 818B shown in FIG. 8B. Curves 810 and 816 are described in further detail below with reference to FIG. 8B.

Figure 8B:
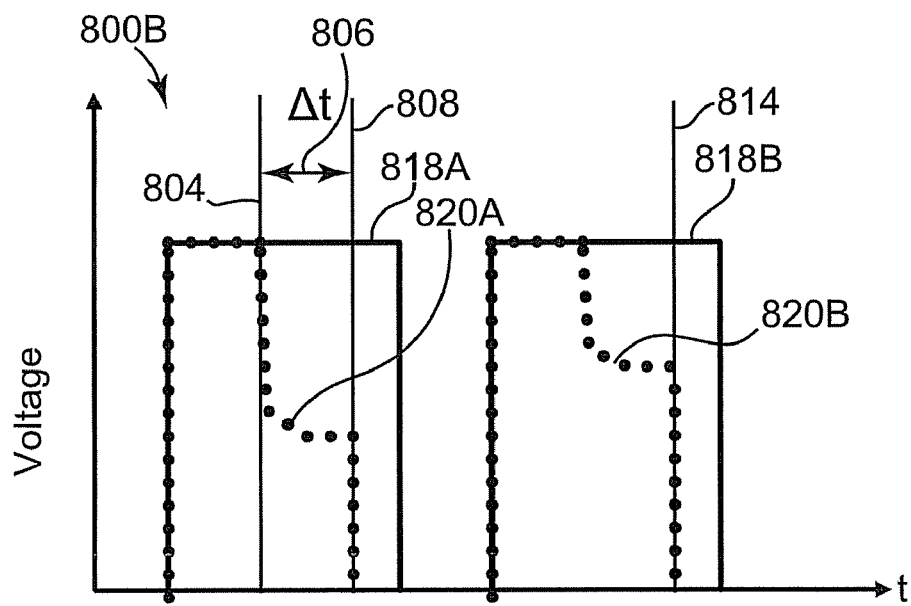
FIG. 8B is a diagram illustrating a graph of multiple feedback controlled initialization pulses according to one embodiment.

FIG. 8B is a diagram illustrating a graph 800B of multiple feedback controlled initialization pulses 818A-818B (collectively referred to as initialization pulses 818) generated by memory device 100 according to one embodiment. The vertical axis in graph 800B represents voltage amplitude, and the horizontal axis represents time. In the illustrated embodiment, the initialization pulses 818 generated by memory device 100 have the same amplitude or substantially the same amplitude as the set pulses (e.g., set pulse 310), and a longer duration than the set pulses (if not cut shorter by the feedback control).

In one embodiment, memory device 100 is configured to monitor the current flowing through a memory cell 104 while initialization pulses 818 are being applied to the memory cell 104. In the embodiment shown in FIGS. 8A and 8B, when the pulse 818A is first applied to a memory cell 104, the current flow through the memory cell 104 gradually begins to increase, as shown by curve 810 in FIG. 8A. The current through the memory cell 104 continues to rise during the application of pulse 818A until the current reaches the current compliance limit 802 at the point in time indicated at 804. Memory device 100 monitors the current through the cell 104, and when the memory device 100 detects that the current has reached the current compliance limit at point 804, memory device 100 causes the voltage pulse 818A to decrease in amplitude as indicated by curve 820A, which holds the current through the cell 104 constant at the compliance limit 802, and prevents the current from exceeding the compliance limit 802. If the current through the memory cell 104 had not reached the compliance limit 802 during the application of the pulse 818A, the pulse 818A would continue on for its normal duration as shown in FIG. 8B. At the point in time 804 at which the current through the cell 104 reaches the compliance limit 802, memory device 100 waits a predetermined period of time ($\Delta t$) 806, and at the end 808 of the period of time 806, memory device 100 terminates the pulse 818A, as shown by curve 820A.

After application of the first pulse 818A to the memory cell 104, the second pulse 818B is applied. When the pulse 818B is first applied to the memory cell 104, the current flow through the memory cell 104 gradually begins to increase, as shown by curve 816 in FIG. 8A. The current through the memory cell 104 continues to rise during the application of pulse 818B until the current reaches the current compliance limit 812. Memory device 100 monitors the current through the cell 104, and when the memory device 100 detects that the current has reached the current compliance limit 812, memory device 100 causes the voltage pulse 818B to decrease in amplitude as indicated by curve 820B, which holds the current through the cell 104 constant at the compliance limit 812, and prevents the current from exceeding the compliance limit 812. If the current through the memory cell 104 had not reached the compliance limit 812 during the application of the pulse 818B, the pulse 818B would continue on for its normal duration as shown in FIG. 8B.

At the point in time at which the current through the cell 104 reaches the compliance limit 812, memory device 100 again waits the predetermined period of time ($\Delta t$), and at the end of this period of time (indicated at 814), memory device 100 terminates the pulse 818B, as shown by curve 820B. In one embodiment, memory device 100 also terminates the initialization pulse sequence at point 814 so that no further initialization pulses are applied to the memory cell 104. The use of current compliance limits 802 and 812 that increase with each subsequent initialization pulse 818 (as shown in FIG. 8A) leads to a stepwise resistance change in the memory cell 104 being initialized.

Figure 9:
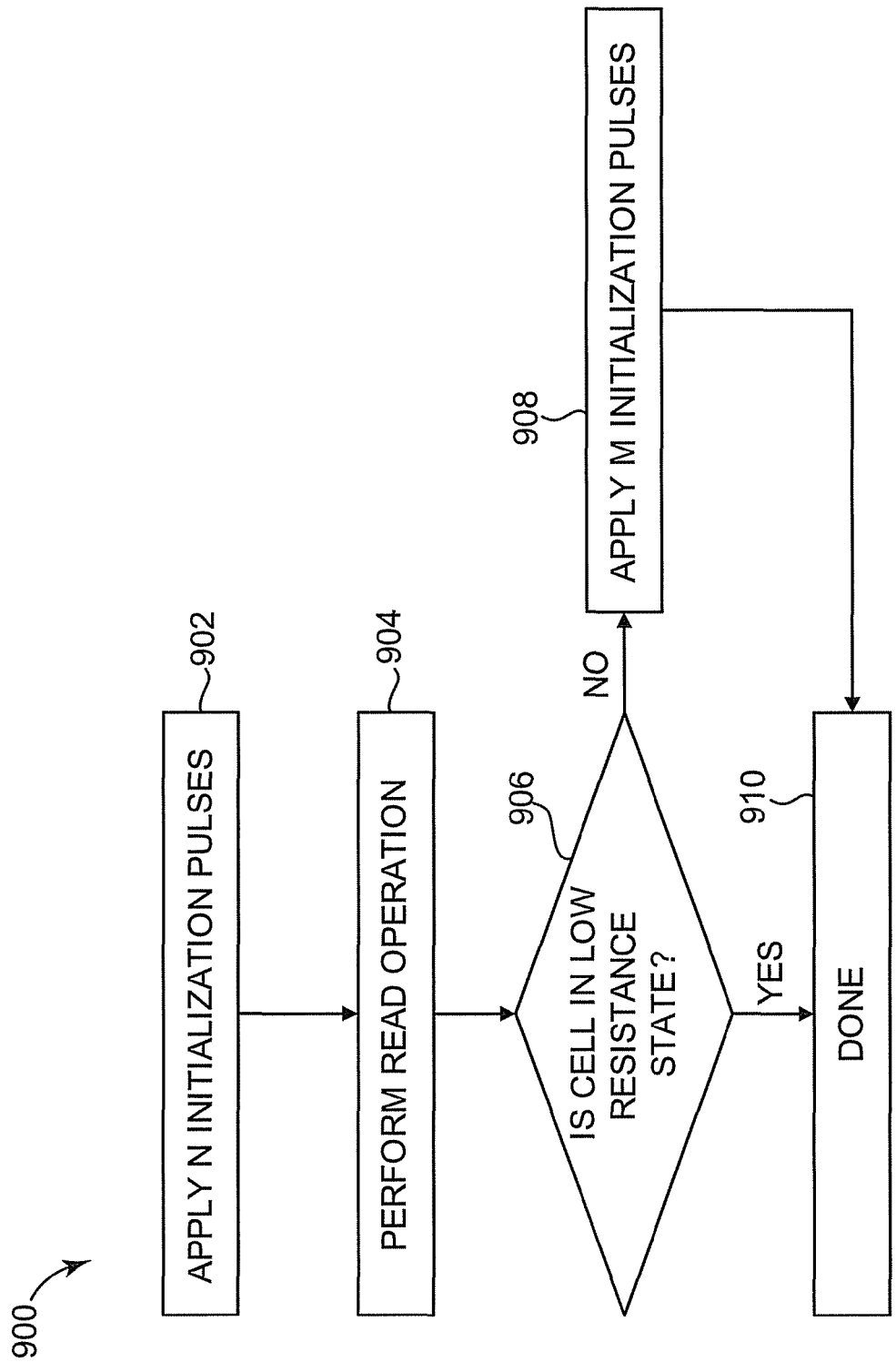
FIG. 9 is a flow diagram illustrating a method for initializing a resistance changing memory cell according to one embodiment.

FIG. 9 is a flow diagram illustrating a method 900 for initializing a resistance changing memory cell 104 according to one embodiment. In one embodiment, memory device 100 is configured to perform method 900. At 902 in method 900, memory device 100 applies a number, N, of initialization pulses to a cell 104 in the memory array 101 that is in a virgin high resistance state, where the number, N, is an integer that is greater than or equal to one. In one embodiment, one or more of the initialization pulses are configured to modify the memory cell 104 in a manner that facilitates switching the memory cell out of the virgin resistance state and into a low resistance state, without actually accomplishing such switching during the application of the pulses. At 904, memory device 100 performs a read operation of the memory cell 104 initialized at 902.

At 906, based on the result of the read operation performed at 904, memory device 100 determines whether the memory cell 104 initialized at 902 is in a low resistance state (set state). If it is determined at 906 that the memory cell 104 is in a low resistance state, the method 900 moves to 910, which indicates that the method 900 is done. If it is determined at 906 that the memory cell 104 is not in a low resistance state, the method 900 moves to 908.

At 908, memory device 100 applies a number, M, of additional initialization pulses to the memory cell 104 initialized at 902, where the number, M, is an integer that is greater than or equal to one. The number, M, of additional initialization pulses applied at 908 may or may not be equal to the number, N, of initialization pulses applied at 902. After application of the initialization pulses at 908, the method 900 moves to 910, which indicates that the method 900 is done. By performing the read operation at 904, and ending the method 900 if it is determined at 906 that the memory cell 104 has switched states, the number of pulses applied to a low resistance cell is limited, which helps to prevent the generation of a cell 104 that is hard to reset.

In one embodiment, an additional read operation is performed after the application of the additional initialization pulses at 908. If the additional read operation indicates that the memory cell 104 did not switch into the low resistive state after the application of the additional initialization pulses at 908, the memory cell 104 is automatically identified as being non-functional (e.g., a hard fail) in one embodiment, and an appropriate error handling may be performed. For example, the error may be signalled to the controller 120.

Figure 10:
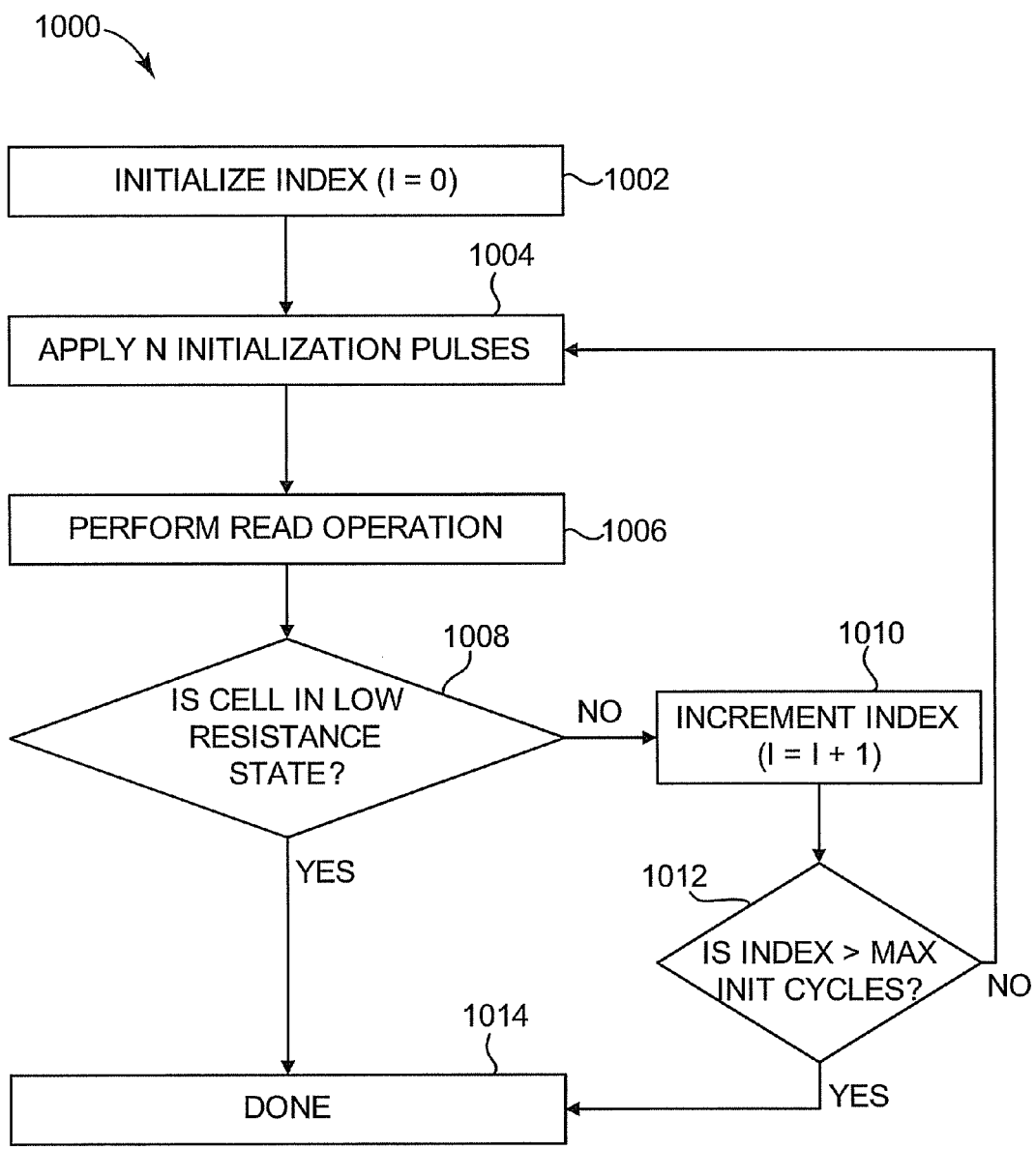
FIG. 10 is a flow diagram illustrating a method for initializing a resistance changing memory cell according to another embodiment.

FIG. 10 is a flow diagram illustrating a method 1000 for initializing a resistance changing memory cell 104 according to another embodiment. In one embodiment, memory device 100 is configured to perform method 1000. At 1002 in method 1000, memory device 100 initializes an index value, I (e.g., I=0). At 1004, memory device 100 applies a number, N, of initialization pulses to a cell 104 in the memory array 101, where the number, N, is an integer that is greater than or equal to one. In one embodiment, one or more of the initialization pulses are configured to modify the memory cell 104 in a manner that facilitates switching the memory cell out of the virgin resistance state and into a low resistance state, without actually accomplishing such switching during the application of the pulses. At 1006, memory device 100 performs a read operation of the memory cell 104 initialized at 1004.

At 1008, based on the result of the read operation performed at 1006, memory device 100 determines whether the memory cell 104 initialized at 1004 is in a low resistance state (set state). If it is determined at 1008 that the memory cell 104 is in a low resistance state, the method 1000 moves to 1014, which indicates that the method 1000 is done. If it is determined at 1008 that the memory cell 104 is not in a low resistance state, the method 1000 moves to 1010.

At 1010, memory device 100 increments the index, I, by one (I=I+1). At 1012, memory device 100 determines whether the index, I, is greater than a maximum initialization cycles threshold value (MAX INIT CYCLES). If it is determined at 1012 that the index, I, is not greater than the maximum threshold value, the method 1000 returns to 1004 to apply another number, N, of initialization pulses to the memory cell 104. If it is determined at 1012 that the index, I, is greater than the maximum threshold value, the method 1000 moves to 1014, which indicates that the method 1000 is done. By performing the read operation at 1006, limiting the number of cycles or iterations of initialization pulses applied to memory cells 104, and ending the method 1000 if it is determined at 1008 that the memory cell 104 has switched states, the number of pulses applied to a low resistance cell is limited, which helps to prevent the generation of a cell 104 that is hard to reset.

In one embodiment, if it is determined at 1012 that the index, I, is greater than the maximum threshold value, the memory cell 104 is automatically identified as being non-functional (e.g., a hard fail), and an appropriate error handling may be performed. For example, the error may be signalled to the controller 120.

In one embodiment, a training sequence of initialization signals is applied to each memory cell 104 in memory array 101 prior to an initial set operation for each cell 104, which reduces the voltage needed for the initial formation of a conducting filament. The training sequence according to one embodiment reduces the risk of damaging the memory cell 104. Additionally, this method of initializing or training memory cells 104 according to one embodiment is material-independent, and can be applied to any TMO memory element. Therefore the material development can be focussed on other device parameters (e.g., switching speed, reset current, etc.) and is not restricted to minimization of the formation voltage. The method of initializing or training memory cells 104 according to one embodiment can be also used to further reduce the formation voltage of memory cells that already have a reduced formation voltage (e.g., such as cells that are under-oxidized).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   an array of resistance changing memory cells; and
   a circuit configured to apply an initialization signal to a first one of the memory cells that is in a virgin resistance state, the initialization signal configured to modify the first memory cell without switching an operation state of the first memory cell.

2. The integrated circuit of claim 1, wherein the initialization signal is configured to modify the first memory cell in a manner that facilitates switching the first memory cell out of a virgin resistance state.

3. The integrated circuit of claim 1, wherein the initialization signal is a voltage pulse.

4. The integrated circuit of claim 3, wherein the voltage pulse has an amplitude that is about the same as or less than a set pulse amplitude for the integrated circuit.

5. The integrated circuit of claim 3, wherein the voltage pulse has a duration that is about the same as a set pulse duration for the integrated circuit.

6. The integrated circuit of claim 3, wherein the voltage pulse has a duration that is longer than a set pulse duration for the integrated circuit.

7. The integrated circuit of claim 1, wherein the initialization signal is a first voltage sweep that increases gradually to a first maximum threshold and then decreases gradually.

8. The integrated circuit of claim 7, wherein the circuit is configured to apply a second voltage sweep to the first memory cell, wherein the second voltage sweep increases gradually to a second maximum threshold and then decreases gradually, and wherein the second maximum threshold is different than the first maximum threshold.

9. The integrated circuit of claim 7, wherein the circuit is configured to monitor a current through the first memory cell during application of the voltage sweep, and apply at least one voltage pulse to the first memory cell if the current exceeds a threshold, the at least one voltage pulse configured to cause the memory cell to switch resistance states.

10. The integrated circuit of claim 1, wherein the circuit is configured to monitor a current through the first memory cell during application of the initialization signal, and terminate the initialization signal if the current exceeds a threshold.

11. The integrated circuit of claim 10, wherein the circuit is configured to terminate the initialization signal a predetermined period of time after the current exceeds the threshold.

12. The integrated circuit of claim 1, wherein the circuit is configured to perform a read operation after application of the initialization signal to determine whether the first memory cell has switched resistance states.

13. The integrated circuit of claim 12, wherein the circuit is configured to repeatedly apply initialization signals to the first memory cell and repeatedly perform read operations until one of the read operations indicates that the first memory cell has switched resistance states or until a maximum number of iterations has been reached.

14. The integrated circuit of claim 13, wherein the circuit is configured to automatically identify the first memory cell as being non-functional if the maximum number of iterations is reached without the first memory cell switching resistance states.

15. The integrated circuit of claim 1, wherein the circuit is configured to perform a read operation after application of a predetermined number of initialization signals to determine whether the first memory cell has switched resistance states, and automatically identify the first memory cell as being non-functional if the read operation indicates that the first memory cell has not switched states.

16. The integrated circuit of claim 1, wherein the resistance changing memory cells are transition metal oxide (TMO) memory cells.

17. The integrated circuit of claim 1, wherein the circuit is configured to monitor a current through the first memory cell during application of the initialization signal, and control the initialization signal to prevent the current from exceeding a first current compliance limit.

18. The integrated circuit of claim 17, wherein the first current compliance limit is smaller than a set pulse current compliance limit of the integrated circuit.

19. The integrated circuit of claim 17, wherein the circuit is configured to apply a second initialization signal to the first memory cell, monitor a current through the first memory cell during application of the second initialization signal, and control the second initialization signal to prevent the current from exceeding a second current compliance limit.

20. The integrated circuit of claim 19, wherein the second current compliance limit is larger than the first current compliance limit, and wherein the second current compliance limit is smaller than a set pulse current compliance limit of the integrated circuit.

* * * * *